United States Patent [19]

Ribner

[11] Patent Number: 4,804,431

[45] Date of Patent: Feb. 14, 1989

[54] MICROWAVE PLASMA ETCHING MACHINE AND METHOD OF ETCHING

[76] Inventor: Aaron Ribner, 1327 Aaron Rd., North Brunswick, N.J. 08902

[21] Appl. No.: 116,036

[22] Filed: Nov. 3, 1987

[51] Int. Cl.$^4$ ................................................. C23F 1/02
[52] U.S. Cl. .................................. 156/345; 156/668; 156/643; 118/722; 118/723; 118/50.1; 319/121.4; 204/157.43; 204/192.36
[58] Field of Search ....................... 156/345, 668, 643; 118/722, 723, 50.1; 219/121 P, 121 PD, 121 PG; 204/157.43, 157.63, 192.36, 192.32

[56] References Cited

U.S. PATENT DOCUMENTS

| | | | |
|---|---|---|---|
| 3,935,371 | 1/1976 | Camacho et al. | 219/121 P |
| 4,149,923 | 4/1979 | Uehara et al. | 219/121 PG |
| 4,224,897 | 9/1980 | Dugdale | 118/50.1 |
| 4,328,258 | 5/1982 | Coleman | 118/50.1 |
| 4,339,326 | 7/1982 | Hirose et al. | 118/723 |
| 4,397,885 | 8/1983 | Akai et al. | 118/50.1 |
| 4,448,149 | 5/1984 | Brown Jr. et al. | 118/723 |
| 4,526,805 | 7/1985 | Yoshizawa | 118/50.1 |
| 4,630,568 | 12/1986 | Kieser | 118/723 |
| 4,718,974 | 1/1988 | Minall | 156/345 |

FOREIGN PATENT DOCUMENTS

| | | | |
|---|---|---|---|
| 0183561 | 6/1986 | European Pat. Off. | 219/121 PD |
| 0119714 | 6/1985 | Japan | 118/723 |
| 0131452 | 6/1986 | Japan | 118/722 |
| 0224324 | 10/1986 | Japan | 118/722 |
| 2142783 | 6/1987 | Japan | 118/722 |

*Primary Examiner*—David L. Lacey
*Assistant Examiner*—L. Johnson
*Attorney, Agent, or Firm*—C. Lamont Whitham; Michael E. Whitham

[57] ABSTRACT

A conventional microwave over has been modified such that it may be used for plasma etching and cleaning. Oxygen or Argon gas is introduced into a vacuum chamber (18) inside a conventional microwave oven (10) that has been modified to allow gas from a canister outside the microwave oven to pass through the rear wall of the microwave oven into the vacuum chamber (18). A rotating antenna (16) ignites the gas to produce a uniform plasma which etches the substrate (28). Reaction by products are evacuated from the vacuum chamber by a vacuum pump positioned outside the microwave oven (10). The intensity of the microwaves can be adjusted for plasma etching via a maximum power control device which has been added to the electronic control circuit of the microwave oven. In addition, a vacuum chamber with a water cooling feature is provided to prevent thermal damage to the substrate during plasma processing.

11 Claims, 4 Drawing Sheets

MICROWAVE PLASMA ETCHING MACHINE AND METHOD OF ETCHING

BACKGROUND OF THE INVENTION

1. Field of the Invention

The present invention generally relates to a plasma etching machine capable of cleaning organic and inorganic substances from a variety of materials and, more particularly, to a plasma etching machine comprising a conventional microwave oven which has been modified to perform this cleaning function.

2. Description of the Prior Art

Plasma assisted etching and cleaning techniques are recognized to have many advantages over chemical etching and cleaning. Plasma cleaning consumes very small quantities of reactants as opposed to the large quantities used in chemical techniques. No significant effluent is produced during plasma cleaning, therefore plasma cleaning does not have a waste disposal problem found with chemical etching. Substrate temperatures are relatively low during processing thereby eliminating damage to the substrate caused by heat exposure. Plasma etching is used in very large scale integrated (VLSI) circuit fabrication because of its superior dimensional control whereby an accurate replication of a photoresist pattern may be etched into an underlying film.

Barbara A. Heath and Lee Kammerdiner have outlined four basic types of equipment used in plasma assisted etching in *VLSI Handbook*, edited by Norman G. Einspruch, published by Academic Press, Inc. in 1985, pages 490 and 491. FIG. 1 shows a barrel etcher where the plasma serves to produce a reactive etchant species. The plasma is often isolated from the wafers by an etch tunnel, leaving the reactant species to reach the wafers by diffusion. The design of the reactor usually results in an isotropic etch profile. Barrel etchers are commonly used for photoresist stripping. FIG. 2 shows a planar plasma (diode) reactor wherein the wafers are loaded onto a grounded electrode. FIG. 3 shows a reactive ion etcher (RIE) wherein the wafers are loaded on a powered electrode. Low pressure operation and the relative size of the electrode to the rest of the chamber cause a direct current (dc) bias to appear on the powered electrode in the RIE system. Ion assisted anisotropic etching results from significant positive ion bombardment of the electrode surface. FIG. 4 shows an ion milling apparatus wherein an ion beam is produced and directed onto the sample. The ion producing plasma is isolated from the sample to be etched.

Plasma is a high density gas of charged particles. Microwaves have been used for several years to produce plasmas. A. Ribner and O. A. Weinreich described the use of a microwave generator to make a plasma for chemical synthesis in "Optical and Electrical Properties of SiC Films Prepared in a Microwave Discharge", *J. Electrochem. Soc.*, vol. 115, page 1090, 1968. Microwave plasma etching has been disclosed in the following patents: U.S. Pat. No. 4,138,306 to Niwa, U.S. Pat. No. 4,357,203 to Zelez, U.S. Pat. No. 4,430,138 to Suzuki et al, U.S. Pat. No. 4,462,863 to Nishimatsu et al, U.S. Pat. No. 4,581,100 to Hazakis et al, U.S. Pat. No. 4,599,100 to Ninomiya, and U.S. Pat. No. 4,609,428 to Fujimura. The machines disclosed in the above listed U.S. Patents are expensive to manufacture and, therefore, a need exists for a less expensive microwave plasma etching machine.

Microwave ovens have become a ubiquitous commodity in today's modern household. Microwave ovens are generally used to cook food and the ability to cook food an order of magnitude more rapidly than a convection oven has been the driving force behind their popularity. U.S. Pat. No. 3,887,392 to Tang discloses a method for using microwave energy to cook foods and to clean semiconductors. When cooking food, a sheet impregnated with oil and seasonings is wrapped around an article of food. Microwave heat allows the seasonings to drip out of the sheet and properly flavor the food. When cleaning semiconductors, a solvent impregnated sheet is spread over the wafers. The solvent mixes with the dirt and oils on the wafers and microwave energy vaporizes the solvent, thereby carrying off the contaminants on the wafers. This method employs a chemical cleaning process which requires dissolving the contaminants in a solvent such as alcohol. The user is required to handle a sheet impregnated with solvent. Organic solvents are known to aid carcinogens in penetrating the human body. Therefore, the cleaning technique contemplated by Tang is hazardous. Moreover, Tang does not contemplate stripping photoresist material.

Early microwave oven designs tended not to cook food evenly such that some parts of a food article would be burned while other parts would be raw after a cooking cycle. Two methods for cooking food uniformly have been developed. One method includes a rotating platform inside the microwave oven. The other method involves a rotating antenna. The principle behind both concepts is to expose all parts of the food article to an equal amount of microwaves.

SUMMARY OF THE INVENTION

It is therefore an object of this invention to provide a low cost microwave plasma etching apparatus which comprises a barrel type etching chamber placed in a conventional microwave oven wherein the microwave oven is used to generate the plasma for etching or cleaning.

It is another object of this invention to install a water cooled planar chamber inside a conventional microwave oven that has been modified to generate plasma for etching or cleaning which allows plasma processing without thermal damage to the substrate.

It is another object of this invention to modify the power controls of the conventional microwave oven by adding a control device such as a potentiometer, variac, or silicon controlled rectifier (SCR) which adjusts the high voltage to the magnetron such that the oven may be used for plasma cleaning.

It is a further object of this invention to equip a conventional microwave oven with a vacuum chamber for plasma cleaning by extending gas inlet and vacuum outlet tubes through the wall of the microwave oven, and by providing suitable safety devices to prevent leakage of hazardous microwaves.

It is a yet another object of this invention to provide even cleaning of articles placed in the microwave plasma etching apparatus by means of a rotating antenna for evenly dispersing the microwaves and plasma subsequently generated.

It is a still further object of the invention to provide a low cost microwave plasma etching apparatus which may be used to sterilize instruments by oxidizing organic compounds or to prepare prosthesis for implantation in a living body.

According to the invention, a power level control, a gas inlet, a flow meter, and a vacuum system are added to a conventional microwave oven. A vacuum chamber is placed inside the microwave oven and is connected to a gas supply and a vaccum system via tubes which extend from the vacuum chamber through the wall of the microwave oven to the gas supply and the vacuum system which are positioned outside the microwave oven. The substrate to be cleaned or etched is placed inside the vacuum chamber. The substrate rests on a holder designed for the user's specific application. For example, conventional wafer boats can be placed inside the chamber to hold semiconductor wafers that are being cleaned. Argon or oxygen gas is supplied to the inside of the vacuum chamber from supply tanks connected to a gas inlet tube. Microwave energy produced by the oven ionizes the gas inside the chamber to produce a highly reactive species which reacts with organic contaminants. For example, oxygen reacting with an organic compound would produce water, carbon monoxide, and carbon dioxide. Gas pressure into the vacuum pump carries the byproducts away from the substrate. The microwave plasma etching machine may be used to clean substrates in hybrid circuit manufacture, clean electronic components before wire bonding for improved wire bond reliability, clean gold plated parts before soldering or welding, clean semiconductors before processing, strip photoresist material, sterilize equipment used in the biological sciences, prepare prosthesis for implantation, clean optical components before assembly, or for a variety of other purposes.

The outer case of the microwave oven is removed and a maximum power control potentiometer is mounted on the rear of the unit. The potentiometer is wired in series with the 115 volt primary of the main transformer. The potentiometer simultaneously adjusts the high voltage to the magnetron and the current to the magnetron filament. Ideally, only the high voltage to the magnetron needs to be adjusted, however, in the microwave oven of the preferred embodiment which has a single transformer, adjustment of only the high voltage to the magnetron is not easily accomplished.

The microwave oven has been modified to include a means for introducing gas into a vacuum chamber located inside the microwave oven and a means for evacuating reaction byproducts from the vacuum chamber. In a preferred embodiment, two holes are drilled through the rear wall of the microwave oven for allowing tubular connections to extend from the vacuum chamber positioned inside the microwave oven to a gas supply and a vacuum pump positioned outside the microwave oven. The legs of the chamber are glued to the floor of the microwave oven. Spring loaded safety rings are installed at the holes through which the vacuum chamber tubes exit the microwave oven. Silicone tubing connects the gas supply and vacuum fittings to the chamger tubes. A safety cage made of steel is installed on the exterior of the microwave around the chamber tubes to reduce leakage to near zero. The cage acts as a barrier to tube breakage. A flowmeter is mounted to the frame of the oven for regulating the supply of gas to the vacuum chamber. A light filter is cemented to the inside of the door of the microwave oven.

The vacuum chamber can have any desired shape and is preferably barrel shaped or rectangular. For example, in one embodiment of this invention a barrel chamber produced by March Instruments, Inc. of Concord, Calif., has been modified for this application. More specifically the inner pyrex chamber, model number 40-009-002, and the outer pyrex chamber, model number 400-054-002, have been employed. Other vendors may have similar chambers available which can be modified for the same purpose. In another embodiment of this invention a rectangular water cooled vacuum chamber is employed. Water cooling allows the plasma to react with temperature sensitive materials without deterioration of the work. For example, photoresist can be removed from mercury cadmium telluride (HgCdTe) which decomposes at 100 C. The water lines, gas inlet tube, and vacuum outlet tubes to the water cooled vacuum chamber are brought out of the microwave oven through commercial bulkhead fittings. Leakage can be eliminated by using steel fittings which absorb microwave energy. If fittings other than steel are used the tubes can be shielded by enclosing them in a steel cage.

During operation, the microwave plasma etching apparatus uses a 2.45 gigahertz (GHz) discharge to excite a plasma inside the vacuum chamber. In the preferred embodiment the microwave oven has a rotating antenna. However, an oscillating or computer controlled antenna motion may also be used. Uniform etching and cleaning results are obtained by dispersing the microwaves in a manner which evenly generates the plasma inside the vacuum chamber. Complete uniformity of the excited plasma results when the antenna is moved at such a speed that all regions of the gas are excited at substantially the same instant. In addition, complete uniformity can be achieved by having a plurality of stationary antennas exciting all regions of the gas at the same instant. Timed uniformity of the excited plasma results from all regions of the gas being excited for substantially the same amount of time. This phenomena occurs when a moving antenna is used to excite all regions of the gas but the antenna moves slow enough such that only one region of the gas is excited at any instant. Both complete uniformity of plasma generation and timed uniformity of plasma generation will achieve uniform etching and cleaning results.

BRIEF DESCRIPTION OF THE DRAWINGS

The foregoing and other objects, aspects and advantages of the invention will be better understood from the following detailed description of the preferred embodiments of the invention with reference to the accompanying drawings, in which.

DETAILED DESCRIPTION OF THE PREFERRED EMBODIMENTS OF THE INVENTION

Figure 1:
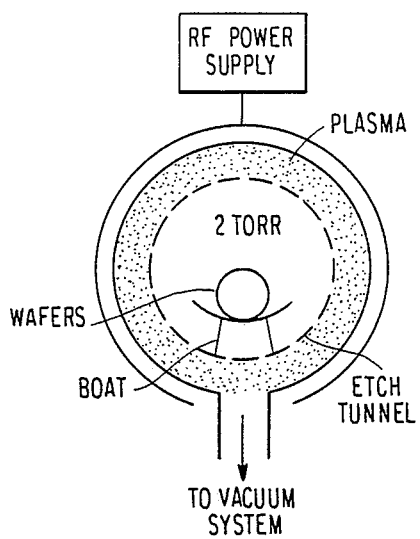
FIG. 1 is a schematic view of a barrel etcher.
Figure 2:
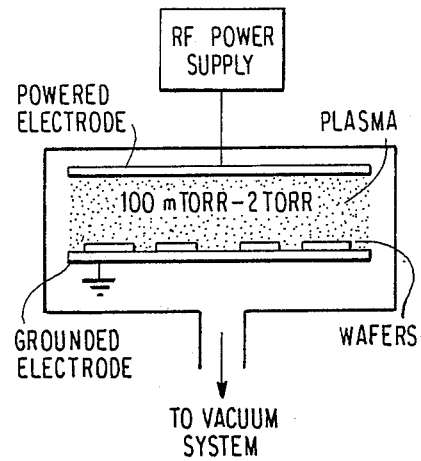
FIG. 2 is a schematic view of a planar plasma reactor.
Figure 3:
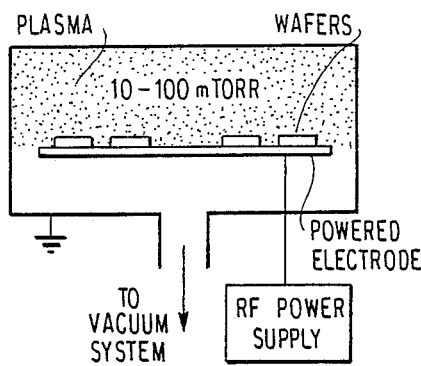
FIG. 3 is a schematic view of a reactive ion etcher.
Figure 4:
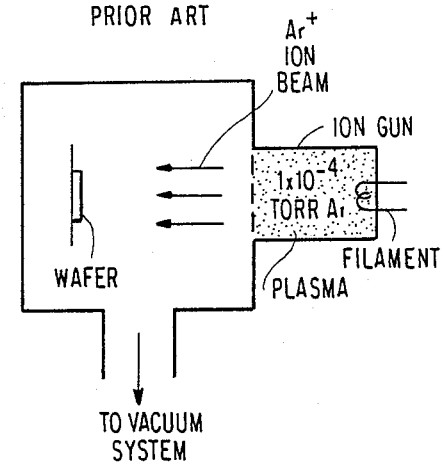
FIG. 4 is a schematic view of an ion milling apparatus.
Figure 5:
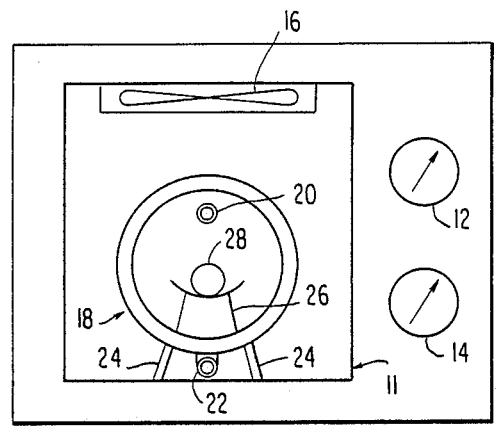
FIG. 5 is a front view of a modified microwave oven with a vacuum chamber positioned inside.

Referring now to the drawings and, more particularly to FIG. 5, a conventional microwave oven 10 is used for plasma etching and cleaning objects placed inside the inner compartment 11. Most microwave ovens include timer controls 12 and duty cycle controls 14 which are employed for scheduling the microwave energy exposure inside the inner compartment 11. Some modern microwave ovens include a rotating antenna 16 for dispersing microwaves evenly inside the microwave oven 10. A vacuum chamber depicted as barrel chamber 18 placed inside the microwave oven 10 includes a gas inlet tube 20 and a vacuum exit tube 22. The gas inlet tube 20 admits argon, oxygen or other gases inside the barrel chamber 18. The plasma is initiated by microwave energy which reacts with an object 28, such as wafers, that is positioned on a holder 26, such as a wafer boat, inside barrel chamber 18. Byproducts produced during etching are evacuated from barrel chamber 18 via vacuum exit tube 22. The support legs 24 of barrel chamber 18 are glued to the floor of the inner compartment to stabilize the chamber 18 and to prevent a user from breaking tubes 20 and 22 if the chamber is accidentally bumped.

Figure 6:
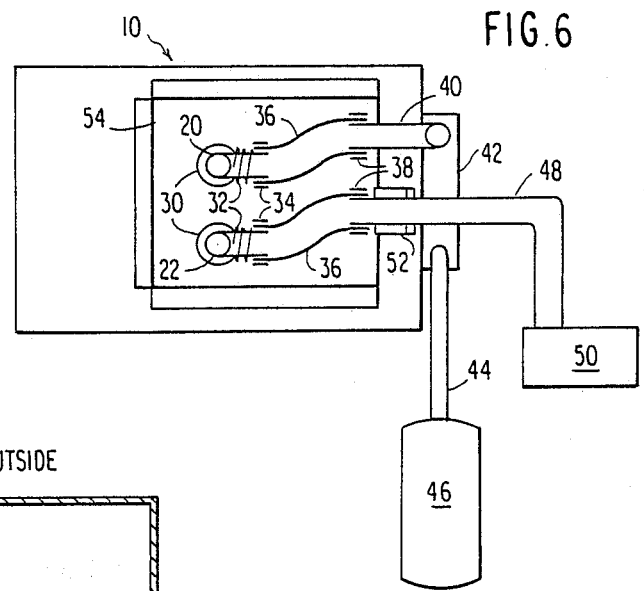
FIG. 6 is a rear view of a modified microwave oven showing safety leakage prevention features and connections to a flow meter, strain relief fitting, vacuum pump, and gas storage tank.

FIG. 6 shows the gas inlet tube 20 and the vacuum exit tube 22 extending from inside the microwave oven 10 through holes which have been drilled therethrough. Steel washers 30 fit closely over vacuum chamber tubes 20 and 22 for absorbing microwave energy. Coil springs 32 force the steel washers 30 snugly against the rear wall of the microwave oven 10. A first pair of hose clamps 34 secure lengths of silicone tubing 36 to vacuum chamber tubes 20 and 22. A second pair of hose clamps 38 secures the opposite ends of the lengths of silicone tubing 36. The top length of silicone tubing 36 is joined to a flow meter 42 via a flow meter connection 40. A gas tank or canister 46 is connected to the flow meter 42 via gas tank tubing 44. The flow meter 42 regulates the supply of gas from the gas tank 46 to the vacuum chamber. In the present invention, a Dwyer Instruments flow meter, model RMA-4-SSV, was used. Flow meter 42 is secured to the frame of microwave oven 10. The bottom length of silicone tubing 36 is joined to a vacuum pump 50 via pump connection 48. A strain relief tube 52, comprising a short length of tubing, is positioned in line with the vacuum pump connection 48 and prevents the vacuum exit tube 22 from breaking if the pump connection 48 is jostled. A steel cage 54 covers a portion of the rear wall of the microwave oven 10 where the vacuum chamber tubes 20 and 22 pass through. The steel cage 54 reduces microwave leakage to near zero and serves to protect the vacuum chamber tubes 20 and 22 from breakage.

Figure 7:
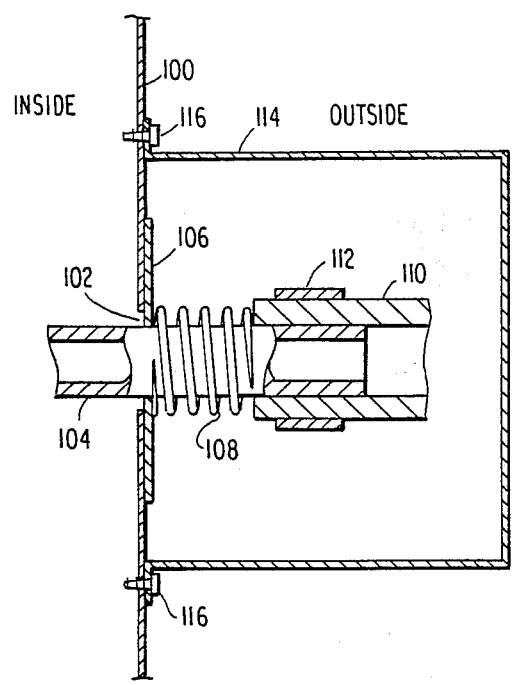
FIG. 7 is an enlarged representational view of a vacuum chamber tube connection which prevents microwave energy leakage from a microwave oven.

FIG. 7 shows an enlarged representational view of a vacuum tube connection using the safety scheme employed in this invention which prohibits leakage of microwave energy to the environment. The rear wall 100 of a microwave oven has an aperture 102 which permits a vacuum chamber tube 104 to pass through. A steel washer 106 fits over the vacuum chamber tube 104 and closely embraces the exterior wall of the vacuum chamber tube. The steel washer 106 is large enough to cover the aperture 102 in the rear wall 100. A spring 108 biases the washer 106 snugly against the rear wall 100. The spring 108 abuts an end of a piece of silicone tubing 110 that is clamped to the vacuum chamber tube 104 by hose clamp 112. A steel cage 114 secured to the rear wall 100 fits over the entire connection. Microwave energy which happens to leak through the aperture 102 is absorbed by the washer 106 and cage 114. Hence, the protection scheme prevents damage to the environment from microwave leakage. Application of this protection scheme is shown in FIG. 6 which shows the rear wall of the modified microwave oven 10 of this invention protected by this same protection scheme with washers 20 and cage 54 reducing the leakage of microwave radiation to near zero.

Figure 8:
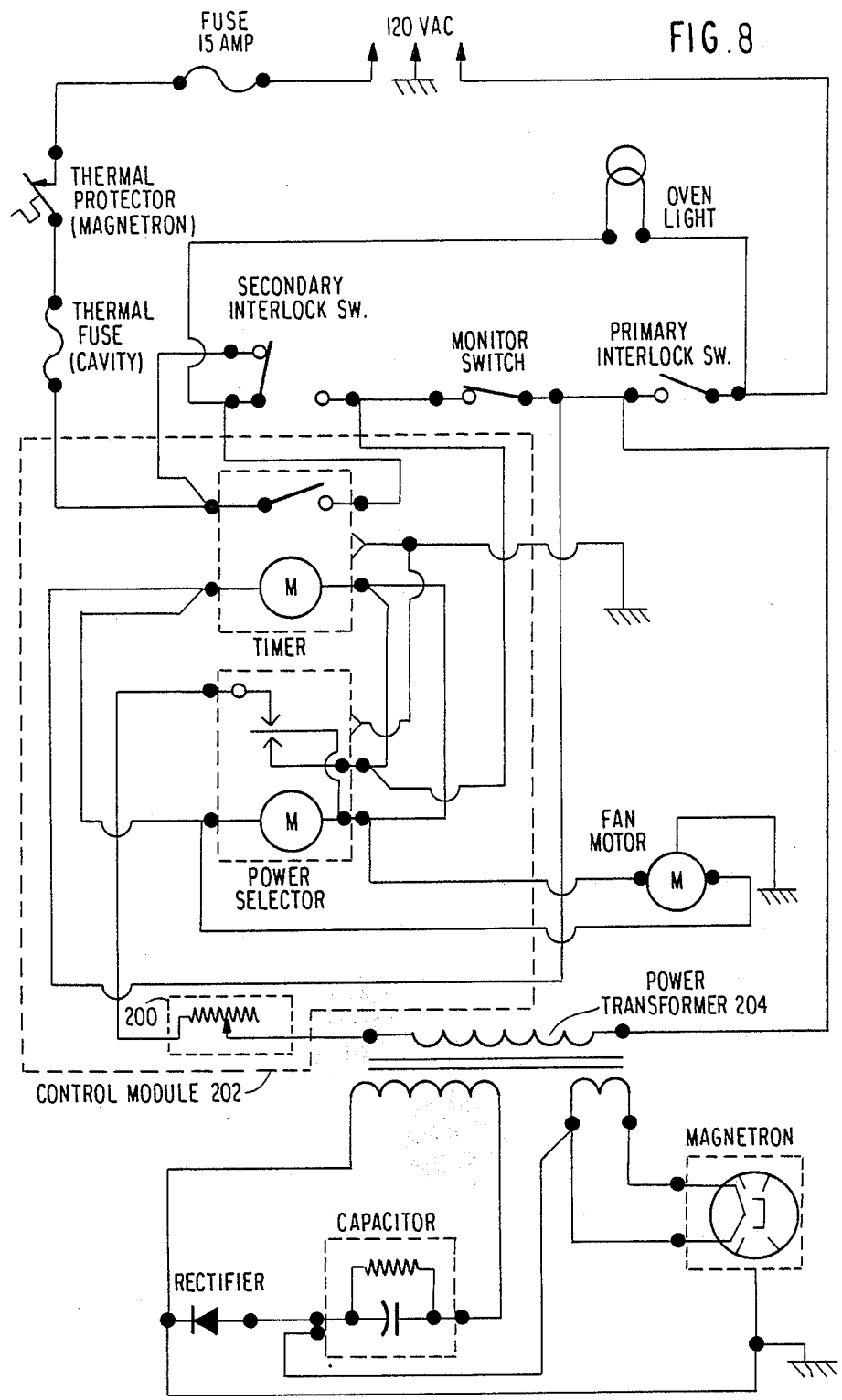
FIG. 8 is a schematic diagram showing a modification to the existing circuitry used in a conventional microwave oven.

FIG. 8 shows that the existing circuitry of a conventional microwave oven has been modified for adjusting the high voltage to the magnetron. In the present invention, a Whirlpool oven, model 1200XS, was used. An Ohmite 25 watt 10 ohm wire wound potentiometer 200 has been placed in the control module 202 in series connection with the power transformer 204. The potentiometer 200 adjusts simultaneously the high voltage to the magnetron and the current to the magnetron filament. This modification is achieved by removing the outer case of the microwave oven and mounting the potentiometer on the rear of the unit. The operator may then use the potentiometer to adjust the high voltage to the magnetron and thereby change the intensity of the microwave energy. Ideally, only the high voltage to the magnetron needs to be adjusted, however, this is not easily accomplished with the single transformer construction of this microwave oven. Other modifications such as the use of a variac, SCR, or transistor would achieve the same maximum power control. Other conventional microwave ovens could be modified in a similar manner for achieving maximum power control.

Figure 9:
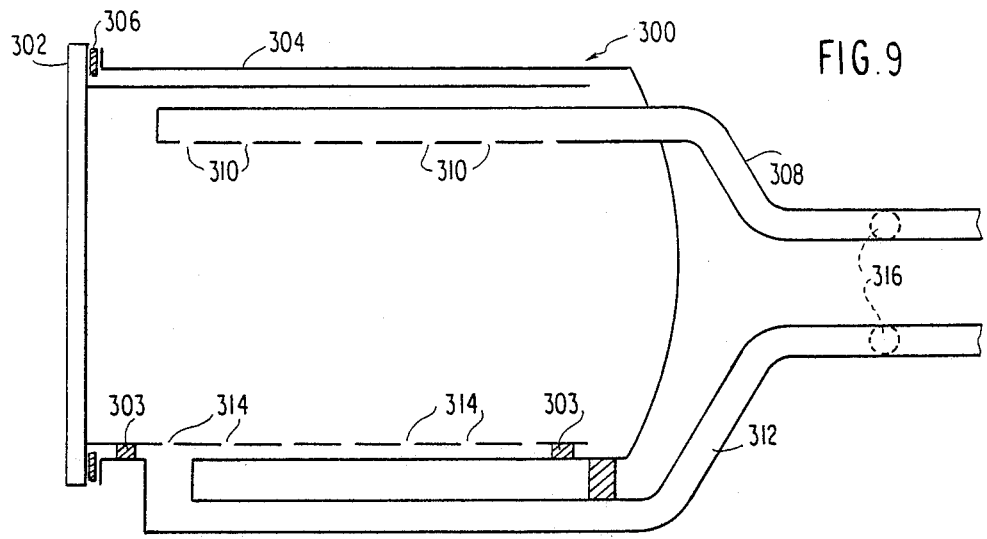
FIG. 9 is a cross-sectional side view of a barrel chamber used as the vacuum chamber in the present invention.

FIG. 9 shows a barrel chamber 300 that may be useed as the vacuum chamber in the modified microwave oven. The barrel chamber 300 comprises a generally cylindrical inner chamber 302 fitting inside a generally cylindrical outer chamber 304. Spacers 303 provide support for the inner chamber 302 and serve to separate it from the outer chamber 304. A flat "O" ring seal 306 is positioned around the outside diameter of the inner chamber 302 between opposing ends of the inner chamber 302 and outer chamber 304. The seal 306 makes the vacuum chamber 300 air tight. The gas inlet tube 308 for supplying argon or oxygen gas that is excited to form a plasma enters through the rear portion of the outer chamber 304. Gas inlet apertures 310 evenly disperse gas inside the vacuum chamber 300. The byproducts from plasma etching are evacuated by the vacuum exit tube 312. Vacuum apertures 314 in the side wall of the inner chamber 302 permit an even gas flow distribution within the vacuum chamber 300. The gas inlet tube 310 and vacuum exit tube 312 may be shaped by bend points 316 after they exit through the rear wall of the microwave oven.

Figure 10:
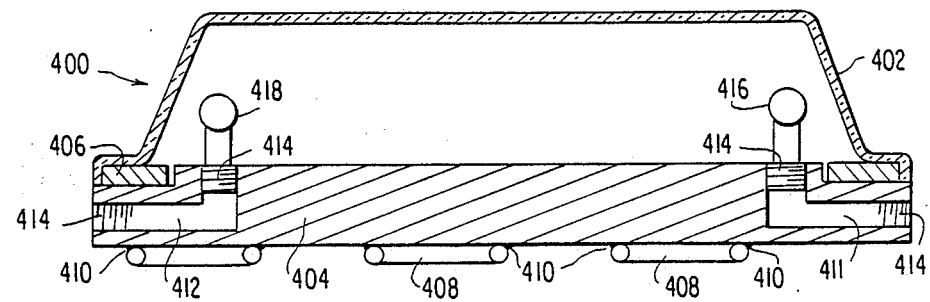
FIG. 10 is a cross-sectional front view of a rectangular water cooled vacuum chamber.
Figure 11:
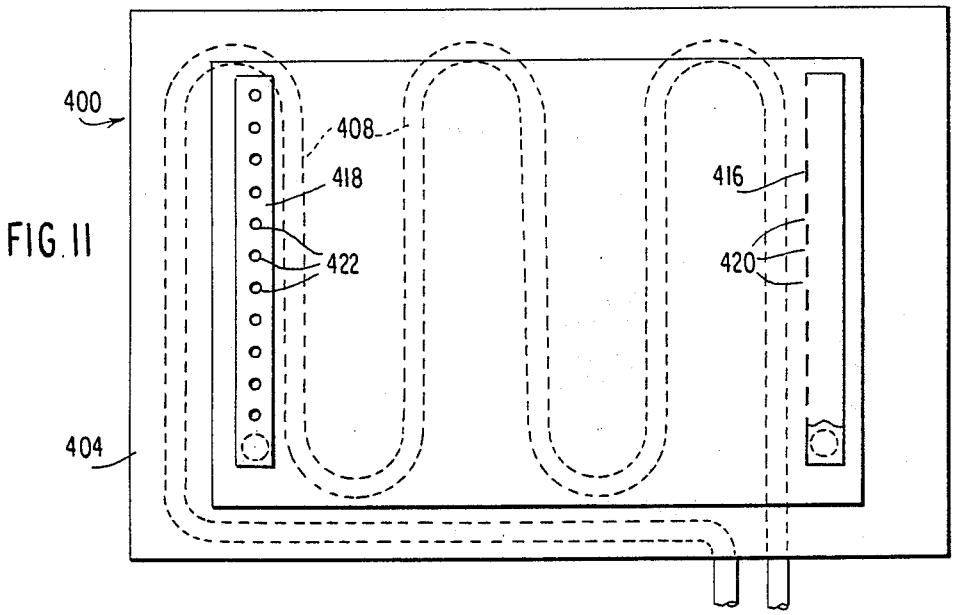
FIG. 11 is a top view of a rectangular water cooled vacuum chamber.

Alternatively, FIG. 10 shows a rectangular water cooled vacuum chamber 400 which may be employed in the modified microwave oven. The rectangular water cooled vacuum chamber has a larger working volume than the barrel chamber. Water cooling allows for plasma processing without thermal damage to the substrate. The water cooled vacuum chamber 400 comprises an inverted bell jar 402 mounted on a machined aluminum base plate 404. The bell jar 402 may be an inverted glass baking dish. A flat silicone "O" ring 406 makes the water cooled vacuum chamber 400 air tight. A water cooling line 408 made of copper of aluminum is held against the base plate 404 by thermally conductive adhesive 410. The base plate 404 has a gas inlet pathway 411 and a vacuum exit pathway 412 machined therein to allow the entrance of gas for forming a plasma and the evacuation of byproducts. The pathways 411 and 412 can be threaded 414 to receive commercial fittings. The gas inlet dispersion tube 416 and gas exit tube 418 are positioned above the base plate 404. FIG. 11 shows a top view of the water cooled rectangular vacuum chamber 400. The water cooling line 408 is formed in a pattern which provides even temperature control of the base plate. The gas inlet dispersion tube 416 has a plurality of gas apertures 420 which admit gas evenly into the water cooled vacuum chamber 400. Byproducts are evacuated at substantially the same rate through vacuum apertures 422 in the gas exit tube 418. Similar to the modification described above, the water line and vacuum chamber tubes extend through holes drilled in the rear wall of the microwave oven. Commercial tube fittings could be used to connect the gas supply and vacuum pump to the vacuum chamber. In this arrangement a microwave seal may not be necessary.

In the operation of the plasma etching machine, a substrate is placed in a vacuum chamber inside a microwave oven that has been modified to include a means for admitting gas from outside the microwave to the inside of the vacuum chamber and a means for withdrawing byproducts from inside the vacuum chamber. If the vacuum chamber is equipped with a water cooling line, this line can be turned on by allowing water to flow from a source through the pattern which is attached to the bottom of the base plate and returned to a drain. Argon or oxygen gas is admitted inside of the vacuum chamber via apertures in a gas inlet tube. A flow meter regulates the supply of gas from a storage tank to the inside of the vacuum chamber. The microwave oven generates a 2.45 Ghz discharge to excite a plasma inside the vacuum chamber. The plasma is generated with either complete uniformity or timed uniformity such that the substrate is etched or cleaned uniformly. Reaction byproducts from the plasma reacting with organic materials on the substrate are evacuated from the vacuum chamber by a vacuum pump. A vacuum exit tube inside the vacuum chamber has a plurality of apertures through which the byproducts are evacuated by the vacuum pressure exerted by the pump outside the microwave oven. The microwave plasma etching machine may be used to clean substrates in hybrid circuit manufacture, clean electronic components before wire bonding for improved wire bond reliability, clean gold plated parts before soldering or welding, clean semiconductors before processing, strip photoresist material, sterilize equipment used in the biological sciences, prepare prosthesis for implantation, clean optical components before assembly, or for a variety of other purposes.

While the invention has been described in terms of the preferred embodiment, practice of the invention can be varied within the spirit and scope of the appended claims.

Having thus described my invention, what I claim as novel and desire to secure by Letters Patent is the following:

1. A plasma etching machine, comprising:
   a microwave oven having a magnetron, a power-transformer and a wall;
   a vacuum chamber positioned inside said microwave oven, said vacuum chamber having means for receiving a substrate to be plasma etched;
   means for admitting a gas inside of said vacuum chamber, said admitting means extending through said wall of said microwave oven to inside said vacuum chamber; and
   means for evacuating reaction byproducts from inside said vacuum chamber, said evacuating means extending from inside said vacuum chamber through said wall of said microwave oven;
   wherein a gas is admitted into said vacuum chamber, microwaves produced by said microwave oven ignite said gas in said vacuum chamber into a plasma, said vacuum chamber further containing a substrate, said plasma reacting with organic contaminants on said substrate inside said vacuum chamber to create reaction byproducts, said reaction byproducts being evacuated from inside said vacuum chamber by said evacuating means.

2. A plasma etching machine as recited in claim 1 wherein said admitting means further comprises flow-meter regulation means for regulating said gas supplied inside said vacuum chamber; and further comprising means for generating a uniform plasma, whereby said plasma evenly etches said substrate in said vacuum chamber.

3. A plasma etching machine as recited in claim 2 wherein said means for generating a uniform plasma comprises a moving antenna for evenly dispersing microwaves on a time average basis inside said vacuum chamber whereby said gas is ignited evenly on a time average basis to generate a plasma of timed uniformity, said plasma evenly etching said substrate inside said vacuum chamber.

4. A plasma etching machine as recited in claim 3 wherein said moving antenna is a rotating antenna.

5. A plasma etching machine as recited in claim 1 wherein said evacuating means comprises a vacuum chamber tube and further comprising a microwave leakage protection scheme including:
   a metal washer having a diameter larger than an aperture in said wall of said microwave oven, said metal washer being positioned over said aperture and being spring biased against said wall of said microwave oven, said metal washer fitting closely against an exterior diameter of said vacuum chamber tube; and
   a metal cage positioned outside said microwave oven on said wall over said aperture, said metal washer and said metal cage absorbing microwave energy generated and reducing microwave leakage from inside said microwave oven to about zero.

6. A plasma etching machine as recited in claim 1 wherein said vacuum chamber further comprises a means for water cooling said vacuum chamber during plasma etching, said water cooling means permitting plasma etching without thermal damage to said substrate.

7. A plasma etching machine as recited in claim 6 wherein said water cooling means comprises a water conducting tube in a heat transfer relationship with said vacuum chamber, said tube being patterned to provide uniform cooling of said vacuum chamber, said tube having an inlet and a drain extending through said wall of said microwave oven, and means for reducing microwave leakage to about zero adjacent said inlet and drain.

8. A plasma etching machine as recited in claim 1 further comprising a power control means for allowing adjustment of a high voltage to said magnetron in said microwave oven, thereby controlling the intensity of microwaves generated by said microwave oven for plasma cleaning.

9. A plasma etching machine as recited in claim 8 wherein said power control means comprises a maximum power control potentiometer in series relationship with a primary of said power transformer for said microwave oven.

10. A method for plasma etching in a microwave oven comprising the steps of:
  providing a microwave oven having a magnetron and a wall,
  placing a substrate inside a vacuum chamber, said vacuum chamber being positioned inside said microwave oven,
  introducing a gas to said vacuum chamber;
  igniting said gas inside said vacuum chamber with microwaves generated from a moving antenna to produce a plasma of timed uniformity;
  etching said substrate which is inside said vacuum chamber by reacting said plasma with organic contaminants on said substrate, said reaction producing byproducts; and
  evacuating said byproducts from said vacuum chamber through said microwave oven wall.

11. A method for plasma etching in a microwave oven as described in claim 10 further comprising the steps of:
  water cooling said vacuum chamber to prevent thermal damage of said substrate during said plasma etching step; and
  adjusting the high voltage to said magnetron in said microwave oven to control the intensity of the microwaves generated in said microwave oven for plasma etching.

* * * * *